(12) United States Patent
Shinada et al.

(10) Patent No.: US 11,851,750 B2
(45) Date of Patent: Dec. 26, 2023

(54) APPARATUS AND METHOD FOR PERFORMING SPUTTERING PROCESS

(71) Applicant: TOKYO ELECTRON LIMITED, Tokyo (JP)

(72) Inventors: Masato Shinada, Tokyo (JP); Einstein Noel Abarra, Tokyo (JP); Hiroyuki Toshima, Yamanashi (JP); Shota Ishibashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 91 days.

(21) Appl. No.: 17/384,058

(22) Filed: Jul. 23, 2021

(65) Prior Publication Data

US 2022/0025511 A1 Jan. 27, 2022

(30) Foreign Application Priority Data

Jul. 27, 2020 (JP) ................................. 2020-126720

(51) Int. Cl.
| | |
|---|---|
| *C23C 14/35* | (2006.01) |
| *C23C 14/04* | (2006.01) |
| *H01J 37/34* | (2006.01) |
| *G02B 27/30* | (2006.01) |

(52) U.S. Cl.
CPC ............ *C23C 14/354* (2013.01); *C23C 14/04* (2013.01); *H01J 37/3447* (2013.01); *G02B 27/30* (2013.01)

(58) Field of Classification Search
None
See application file for complete search history.

(56) References Cited

U.S. PATENT DOCUMENTS

| 5,873,989 A * | 2/1999 | Hughes | H01J 37/3455 |
| | | | 204/298.14 |
| 2009/0194409 A1* | 8/2009 | Utsunomiya | H01J 37/3408 |
| | | | 204/192.12 |
| 2013/0299345 A1* | 11/2013 | Abarra | C23C 14/225 |
| | | | 204/298.11 |
| 2015/0114835 A1* | 4/2015 | Gomi | H01J 37/3447 |
| | | | 204/298.08 |

FOREIGN PATENT DOCUMENTS

| JP | 2016-033266 A | 3/2016 |
| JP | 2017-166056 A | 9/2017 |

* cited by examiner

*Primary Examiner* — Jason Berman
(74) *Attorney, Agent, or Firm* — Fenwick & West LLP

(57) ABSTRACT

An apparatus for performing a sputtering process on a substrate is provided. The apparatus includes a processing chamber having a substrate support on which the substrate is placed, a target for emitting target particles to be adhered to the substrate by plasma formed in the processing chamber, a magnet, provided on a rear surface of the target, for adjusting a state of the plasma on the surface of the target, and a magnet moving mechanism for repeatedly moving the magnet between a position on one side and a position on the other side set across a center portion on the rear surface of the target. The apparatus further includes a collimator having two regulating plates for limiting an incident angle of the target particles to the substrate, and an arrangement position adjustment mechanism adjusting positions of the two regulating plates according to the movement of the magnet.

15 Claims, 9 Drawing Sheets

APPARATUS AND METHOD FOR PERFORMING SPUTTERING PROCESS

CROSS-REFERENCE TO RELATED APPLICATIONS

This application claims priority to Japanese Patent Application No. 2020-126720, filed on Jul. 27, 2020, the entire contents of which are incorporated herein by reference.

TECHNICAL FIELD

The present disclosure relates to an apparatus and method for performing a sputtering process.

BACKGROUND

In a manufacturing process of a semiconductor device, for example, a magnetron sputtering device is used for forming a metal film. This apparatus is configured such that a target made of a film forming material is disposed in a vacuum processing chamber, a magnetic field and an electric field are formed to generate plasma, and the target is sputtered by ions of the plasma.

Japanese Patent Application Publication No. 2016-33266 discloses a sputtering apparatus, in which a first shielding portion and a second shielding portion are disposed between a substrate and a target obliquely facing the substrate, the first and second shielding portions are moved to adjust a size of an opening portion above the substrate, and a portion of the target can be covered by using a third shielding portion. Further, Japanese Patent Application Publication No. 2017-166056 discloses a sputtering apparatus, in which a target is disposed to face a substrate and a collimator having a plurality of through holes is provided between the target and the substrate so as to cover the entire surface of the substrate.

SUMMARY

The present disclosure provides a technique capable of limiting an incident angle at which target particles are incident on a substrate and controlling the directivity of the target particles.

In accordance with an aspect of the present disclosure, there is provided an apparatus for performing a sputtering process on a substrate, the apparatus including: a processing chamber configured to accommodate a substrate and having a substrate support on which the substrate is placed; a target, having a surface disposed to face the substrate placed on the substrate support, for emitting target particles to be adhered to the substrate by plasma formed in the processing chamber; a magnet, provided on a rear surface of the target when viewed from the substrate support side, for adjusting a state of the plasma on the surface of the target;

a magnet moving mechanism for repeatedly moving the magnet between a position on one side and a position on the other side set across a central portion on the rear surface of the target; and a collimator provided between the substrate support and the target, wherein the collimator includes two regulating plates, disposed apart from each other and facing each other, for limiting an incident angle at which the target particles emitted from the target are incident on the substrate placed on the substrate support, and an arrangement position adjustment mechanism for adjusting positions at which the two regulating plates are disposed according to the movement of the magnet.

BRIEF DESCRIPTION OF THE DRAWINGS

The objects and features of the present disclosure will become apparent from the following description of embodiments, given in conjunction with the accompanying drawings, in which:

FIGS. 9A through 7C are plan views for describing the operation of the sputtering apparatus according to the second embodiment.

DETAILED DESCRIPTION

First Embodiment

Figure 1:
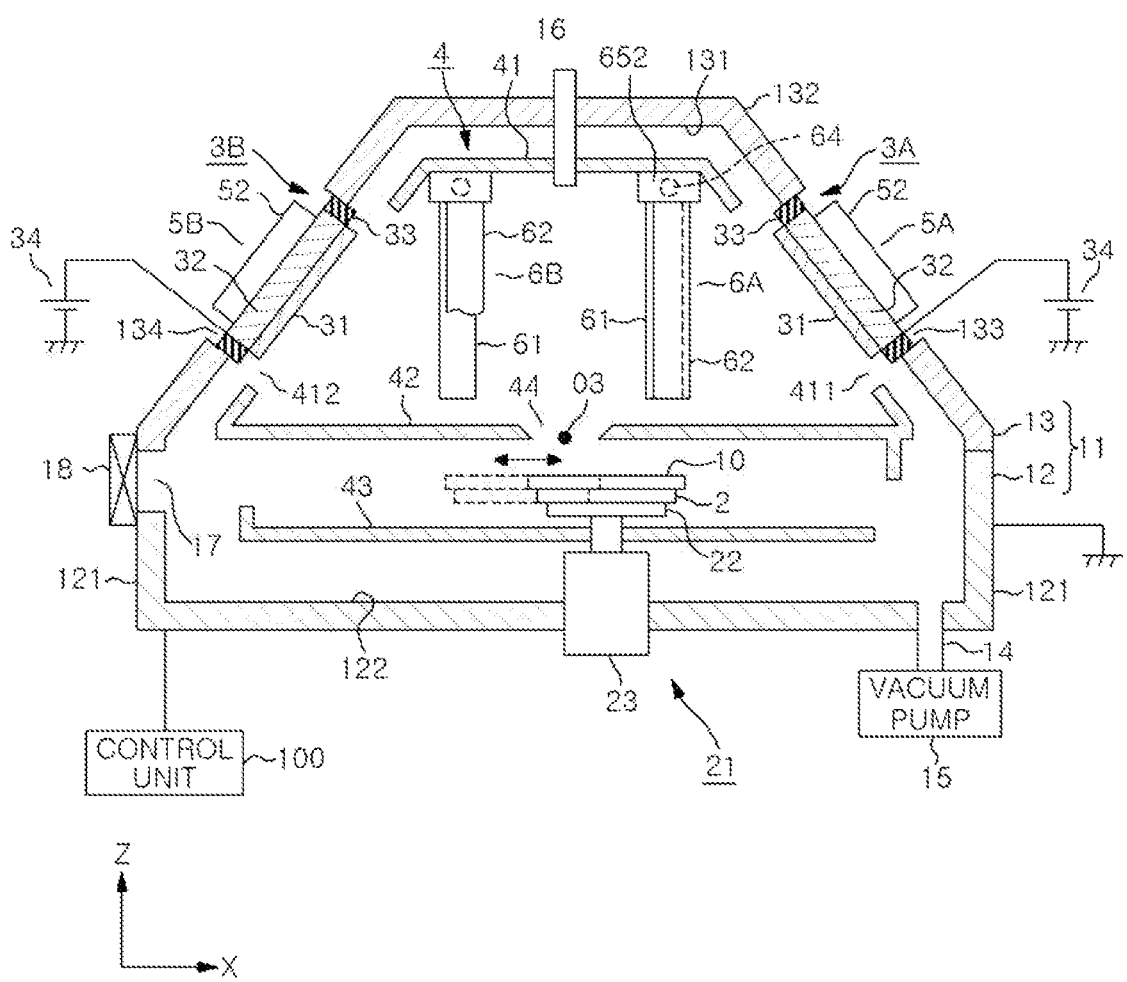
FIG. 1 is a vertical sectional side view illustrating a sputtering apparatus according to a first embodiment.
Figure 2:
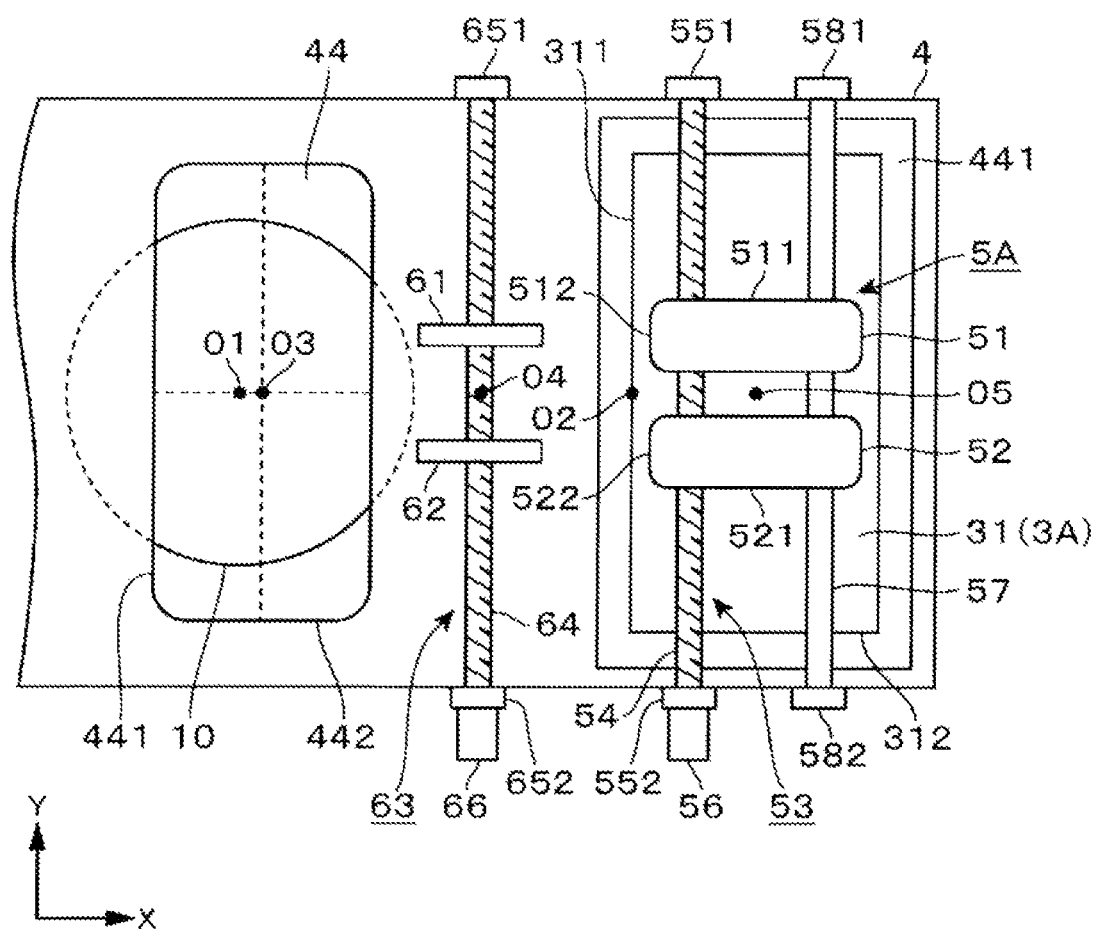
FIG. 2 is an enlarged plan view illustrating a portion of the sputtering apparatus according to the first embodiment.

Hereinafter, a first embodiment of an apparatus (hereinafter, referred to as a "sputtering apparatus") for performing a sputtering process of the present disclosure will be described with reference to the accompanying drawings. FIG. 1 is a schematic cross-sectional view illustrating a configuration example of the sputtering apparatus, and FIG. 2 is a plan view illustrating a portion of the sputtering apparatus. In the attached drawings, dimensions, arrangement intervals, and the like of the same members are changed as necessary and drawn.

The sputtering apparatus 1 of this example is configured as an apparatus that performs a sputtering process for forming, for example, a metal film on the surface of a semiconductor wafer (hereinafter, referred to as "wafer") 10 which is a substrate. In FIG. 1, the reference numeral 11 refers to a processing chamber made of, for example, aluminum (Al) and grounded. The processing chamber 11 includes a main body 12 which is a substantially cylindrical chamber having an opening on its upper surface, and a cover 13 which closes the opening of the main body 12. The processing chamber 11 is connected to a vacuum pump 15 which is a vacuum exhaust mechanism via an exhaust passage 14 and is also connected to a source (not illustrated) supplying an inert gas, such as Ar gas, via a supply port 16. The reference numeral 17 in FIG. 1 refers to a transfer port of a wafer 10 which is formed on a side wall 121 of the main body 12 and configured to be openable and closable by a gate valve 18.

A substrate support 2 on which the wafer 10 is placed in a horizontal state is provided inside the processing chamber 11, and the substrate support 2 can hold the wafer 10 by a substrate support moving mechanism 21 and move the wafer 10 in a lateral direction. The substrate support moving mechanism 21 of this example moves the substrate support 2 in the lateral direction (X direction in FIG. 1) along a base 22 and moves the base 22 in a vertical direction (Z direction in FIG. 1) by a raising/lowering mechanism 23. A sealing mechanism (not illustrated) for maintaining an internal space of the processing chamber 11 airtight is provided at a position where the raising/lowering mechanism 23 passes through a bottom surface 122 of the main body 12. Moreover, although not illustrated, the substrate support 2 includes a heating mechanism for heating the wafer 10 and a push-up pin for transferring the wafer 10 between an external transport arm (not illustrated) and the substrate support 2.

In this example, the wafer 10 on the substrate support 2 moves laterally from a first position to a second position at the time of film formation. For example, the first position is a position where the left end of the wafer 10 is disposed below and aligned with the left end of a slit 44 described below, as illustrated by the solid lines in FIG. 1. Further, the second position is a position where the wafer 10 moves to the left from the first position and the right end of the wafer 10 is disposed below and aligned with the right end of the slit 44, as illustrated by the broken lines in FIG. 1. Moreover, for example, an external transport arm (not illustrated) is introduced by the operation of the raising/lowering mechanism 23 described above, and the wafer 10 on the substrate support 2 is vertically raised or lowered between a height position when the wafer 10 is transferred between the substrate support 2 and the transport arm and a height position at the time of the film formation.

A configuration of the substrate support moving mechanism 21 is not limited to that illustrated in FIG. 1 and may have any configuration as long as a horizontal moving mechanism for laterally moving the substrate support 2 holding the wafer 10 is included. For example, the horizontal movement mechanism may have a configuration in which a substrate support is screwed into the ball screw and the ball screw is rotationally driven by a drive motor. Further, the horizontal movement mechanism may have a configuration in which the substrate support is fixed to a moving body that slides on a rail and a drive mechanism for sliding the moving body is provided. In addition, the horizontal movement mechanism may have various configurations such as a configuration in which the substrate support is connected to a timing belt of a pulley belt mechanism, the timing belt is rotated by a drive motor, and the connection portion of the substrate support is horizontally moved. Moreover, the raising/lowering mechanism 23 may adopt a configuration in which a vertical raising/lowering shaft is rotationally driven by a drive motor to move in a vertical direction.

As illustrated in the vertical sectional side view of FIG. 1, the cover 13 of this example faces the bottom surface 122 of the processing chamber 11 and includes a disk-shaped ceiling portion 131. A diameter of the ceiling portion 131 is set to be smaller than a diameter of the bottom surface 122 of the circular tray-shaped main body 12. When viewed from above, for example, the center of the ceiling portion 131 and the center of the bottom surface 122 are aligned, and the outer edge of the ceiling portion 131 and the upper edge of the side wall 121 of the main body 12 are connected via a tapered side wall 132 of the cover 13.

In the side wall 132 of the cover 13, for example, openings 133 and 134 are formed at two opposing positions in a plan view, and target electrodes 3 (3A and 3B) are formed to close the openings 133 and 134. Each target electrode 3 is formed by joining a conductive base plate 32 made of, for example, copper (Cu) or aluminum (Al) to the upper surface of a target 31. The target 31 emits target particles to be adhered to the wafer 10 by the plasma in the processing chamber 11. For example, the target 31 is made of Ti (titanium), Si (silicon), Zr (zirconium), Hf (hafnium), tungsten (W), a cobalt-iron-boron alloy, a cobalt-iron alloy, iron (Fe), tantalum (Ta), ruthenium (Ru), magnesium (Mg), iridium manganese (IrMn), platinum manganese (PtMn), or the like. Further, the target 31 may be made of an insulator, such as SiO2, besides the metal.

The target 31 and the base plate 32 are each formed in a rectangular shape in a plan view. For example, the target 31 is disposed along the tapered surface of the side wall 132 so that a long side 311 of the rectangle is directed to a horizontal direction. Further, as illustrated in FIG. 2, when viewed from above, for example, the center O1 of the wafer 10 held on the substrate support 2 and the center O2 of the long side 311 of the target 31 are aligned with each other in a front-rear direction (Y direction in FIG. 2). With the above configuration, when viewed from the wafer 10 held on the substrate support 2, each of the target electrodes 3A and 3B is disposed so that a surface of the target 31 faces the wafer 10 and is inclined diagonally upward in the lateral direction (X direction in FIG. 1) of the wafer 10. Hereinafter, the lateral direction will be referred to as the X direction, and the front-rear direction will be referred to as the Y direction.

For example, the length of the long side 311 of the target 31 is set to be larger than the diameter of the wafer 10 as illustrated in FIG. 2. The base plate 32 is formed to be the same as or larger than the target 31 and is provided on the cover 13 with, for example, an annular insulating member 33 is interposed therebetween (see FIG. 1). In this way, the target electrodes 3A and 3B are fixed to the processing chamber 11 in a state of being electrically insulated from the processing chamber 11, and a direct current (DC) voltage is applied to the target electrodes 3A and 3B by a power supply unit 34. An alternating current (AC) voltage may be applied instead of the DC voltage.

Further, a shield member 4 is provided inside the processing chamber 11. The shield member 4 is provided to suppress the adhesion of sputtered particles to the inner walls of the processing chamber 11 and is made of, for example, a conductor such as aluminum or an alloy using aluminum as a base material. In this example, the shield member 4 includes first, second and third shield members 41, 42, and 43.

The first shield member 41 is provided to cover an inner side of the cover 13, openings 411 and 412 are formed in regions corresponding to the targets 31, and the lower surface of each target 31 is exposed inside the processing chamber 11. The second shield member 42 forms a shielding plate and is provided between the substrate support 2 and regulating plates 61 and 62 described below so as to face the bottom surface 122 of the main body 12. A slit 44, which is an opening for exposing a portion of the wafer 10 mounted on the substrate support 2, is formed at the center of the second shield member 42.

The slit 44 is an opening through which the target particles pass and, as illustrated in FIG. 2, is formed in, for example, a substantially rectangular shape in a plan view so that its long side 441 extends in the Y direction and its short side 442 extends in the X direction. That is, the slit 44 is formed in a rectangular shape the long side of which extends in moving directions of magnets 51 and 52, as will be described below. In this example, the center O3 of the slit 44 is disposed to be aligned with the center of the bottom surface 122 of the main body 12 when viewed from above.

The slit 44 is formed so that the length of its long side 441 is larger than the diameter of the wafer 10 and the length of its short side 442 is smaller than the diameter of the wafer 10.

At the time of film formation, the wafer 10 held by the substrate support 2 moves below the slit 44 while, for example, a positional relationship between the slit 44 and the wafer 10 is set so that the center O1 of the wafer 10 passes below the center O3 of the slit 44. Further, the first position and the second position are determined according to the shape of the slit 44 such that the entire surface of the wafer 10 passes below the slit 44 by moving the wafer 10 on the substrate support 2 from the first position to the second position.

Further, the third shield member 43 is provided to face the second shield member 42 below the substrate support 2 and not hinder the transfer of the wafer 10 between the substrate support 2 and the external transport arm. The first to third shield members 41 to 43 are connected to, for example, inner walls of the processing chamber 11, and are grounded via the processing chamber 11. Moreover, the configuration illustrated in FIGS. 1 and 2 is exemplary, and the configuration of the shield member 4 may be set in any appropriate manner.

The magnet units 5 (5A and 5B) are provided on the target electrodes 3A and 3B to be close to the target electrodes 3A and 3B. FIG. 2 schematically illustrates an arrangement of the magnet unit 5A, the slit 44, and the wafer 10 on the substrate support 2 with respect to the magnet unit 5A provided on a right side of the sputtering apparatus 1 in FIG. 1. In FIG. 2, for convenience of illustration, the first and second shield members 41 and 42 are collectively shown, and a description of the base plate 32 is omitted.

Since the magnet units 5A and 5B are configured in the same manner, an example of the magnet unit 5A will be described herein. The magnet unit 5A includes, for example, the magnets 51 and 52 which are two permanent magnets and a magnet moving mechanism 53 for moving the magnets 51 and 52 in the Y direction. The magnets 51 and 52 have a function of adjusting a state of plasma on the surface of the target 31. As illustrated in FIG. 2, the two magnets 51 and 52 are formed in the same manner, and the outer shape thereof is formed as, for example, a substantially rectangular parallelepiped shape when viewed in a plan view.

Each of the magnets 51 and 52 is configured by combining a plurality of magnet elements constituting a magnetic circuit. For example, each of the magnets 51 and 52 is configured by a combination of four magnet elements provided along four sides of its outer shape and one magnet element provided at its center and spaced apart from the four magnet elements. The polarity of the magnet elements provided along the four sides on the target 31 is different from the polarity of the magnet element provided at the center on the target 31. However, this example is one of the configuration examples of the magnets 51 and 52 and is not limited to this configuration.

The magnets 51 and 52 have long sides 511 and 521 extending in the X direction and short sides 512 and 522 extending in the Y direction, and are spaced apart from each other in the Y direction. Further, an area of regions where the magnets 51 and 52 are disposed is set to be smaller than an area of the target 31 when viewed from the substrate support 2.

The magnet moving mechanism 53 is configured to repeatedly move the magnets 51 and 52 between a position on one side and a position on the other side set across a central portion on the rear surface of the target 31. In this example, the position on the one side is referred to as one end of the target 31 in the Y direction, and the position on the other side is referred to as the other end of the target 31 in the Y direction.

For example, the magnet moving mechanism 53 includes a ball screw mechanism, a ball screw 54 is disposed to extend above the target 31 in the Y direction, and the ball screw 54 is screwed into screw holes passing through each of the magnets 51 and 52. The ball screw 54 is set to a length that covers moving regions of the magnets 51 and 52, and one end and the other end of the ball screw 54 are rotatably supported by bearing portions 551 and 552. Further, a drive motor 56 forming a drive mechanism is connected to the other end side of the ball screw 54 via the bearing portion 552.

In FIG. 2, the reference numeral 57 is a rod-shaped guide member, which is provided to extend in the Y direction over the target 31 in parallel to the ball screw 54, and one end and the other end of the guide member 57 are respectively supported by bearing portions 581 and 582. For example, when the magnets 51 and 52 are viewed from the front, the ball screw 54 is attached at a position closer to the substrate support 2 than to the centers of the magnets 51 and 52, and the guide member 57 is provided at a position closer to the side wall 121 than to the center.

The two magnets 51 and 52, being separated from each other with a pre-set separation gap in the Y direction, are attached to the ball screw 54 and the guide member 57. Then, the magnets 51 and 52, maintaining the separation gap therebetween, move back and forth between one end and the other end of the target 31 in the Y direction by the forward and backward rotation of the ball screw 54 by using the drive motor 56. In this example, the bearing portions 551, 552, 581, and 582 and the drive motor 56 are attached to, for example, the cover 13.

In the processing chamber 11, collimators 6 (6A and 6B) are respectively provided between the targets 31 and the slits 44. The collimators 6A and 6B are configured in the same manner, and, here, with reference to FIGS. 1, 2 and 3, an example of the collimator 6A provided on the right side of the sputtering apparatus in FIG. 1 will be described. The collimator 6A includes two regulating plates 61 and 62 spaced apart from and facing each other, and also has an arrangement position adjustment mechanism for adjusting positions at which the regulating plates 61 and 62 are disposed according to the movement of the magnets 51 and 52.

Figure 3:
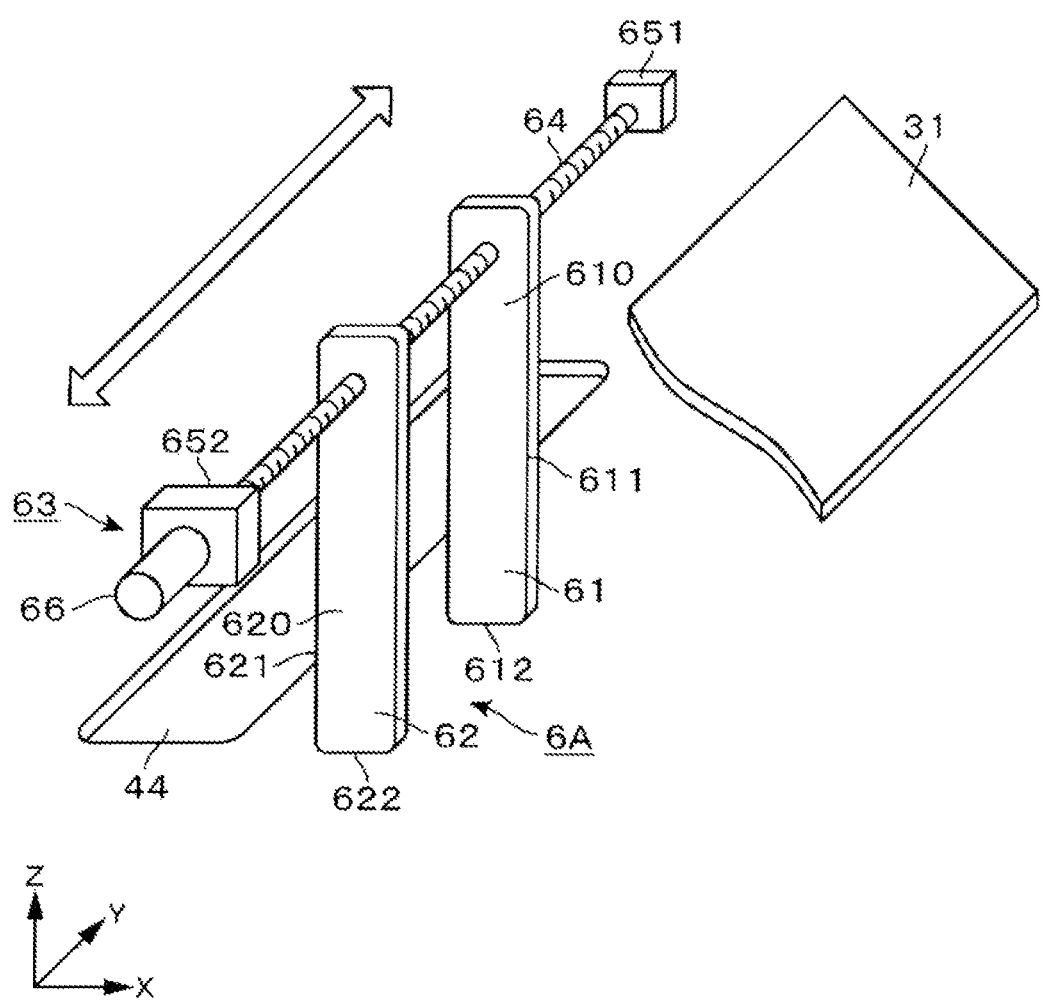
FIG. 3 is a schematic perspective view illustrating a portion of the sputtering apparatus according to the first embodiment.

As illustrated in FIGS. 1, 2 and 3, the regulating plates 61 and 62 are each formed in the same shape, and are formed in an elongated rectangular plate-like body when viewed from the front, for example. As illustrated in FIG. 3, in the regulating plates 61 and 62, each of plate surfaces 610 and 620 is orthogonal to the Y direction along which the regulating plates 61 and 62 move, long sides 611 and 621 thereof extend in the Z direction, and short sides 612 and 622 thereof extend in the X direction.

Further, the regulating plates 61 and 62 are disposed so that their plate surfaces 610 and 620 are spaced apart from and face each other in the Y direction.

In this example, as illustrated in FIG. 2, dimensions of the regulating plates 61 and 62 in the X and Y directions are set to be smaller than dimensions of the magnets 51 and 52 in the X and Y directions when viewed from above. Further, when viewed from above, for example, the center position O4 between the regulating plates 61 and 62 and the center position O5 between the magnets 51 and 52 are disposed to be aligned with each other in the Y direction.

The arrangement position adjustment mechanism of this example is configured as a regulating plate movement mechanism 63 for moving the regulating plates 61 and 62 following the movement of the magnets 51 and 52. As illustrated in FIGS. 2 and 3, the regulating plate movement mechanism 63 includes, for example, a ball screw mechanism, a ball screw 64 is disposed in the Y direction, which is the moving direction, and the ball screw 64 is screwed into the screw holes formed on an upper end of each of the regulating plates 61 and 62. One end and the other end of the ball screw 64 are rotatably supported by bearing portions 651 and 652, and a drive motor 66 forming a drive mechanism is connected to the other end of the ball screw 64 via the bearing portion 652.

In this way, by using the drive motor 66, the regulating plates 61 and 62, maintaining the separation gap therebetween, are configured to move back and forth between one end and the other end of the target 31 in the Y direction by the forward and backward rotation of the ball screw 64 by using the drive motor 66. The ball screw 64 has a length that covers moving regions of the regulating plates 61 and 62, and the bearing portions 651 and 652 and the drive motor 66 are attached to, for example, the first shield member 41.

As will be described below, the magnets 51 and 52 move in the Y direction, and the positions where the regulating plates 61 and 62 are disposed are adjusted according to the movement of the magnets 51 and 52. Therefore, even when the magnets 51 and 52 move in the Y direction, a positional relationship between the magnets 51 and 52 and the regulating plates 61 and 62 is maintained so that the center positions O4 and O5 thereof are aligned in the Y direction when viewed from above. The shape and size of the magnets 51 and 52 and the regulating plates 61 and 62, and the separation gap therebetween are set in an appropriate manner according to the type of film to be formed and film-forming conditions. A member constituting the regulating plates 61 and 62 is made of, for example, a ceramic or resin.

The sputtering apparatus 1 having the configuration as described above includes a control unit 100 for controlling operations of the moving mechanisms 53 and 63, a power supply operation from the power supply unit 34, a supply operation of an Ar gas, and the like. The control unit 100 comprises, for example, a computer including a central processing unit (CPU) and a storage unit (not illustrated). In the storage unit, a program with a group of steps (commands) for control necessary for forming a film on the wafer 10 by the sputtering apparatus 1 is stored. For example, the program includes a configuration that controls driving of the magnet moving mechanism 53 and the regulating plate movement mechanism 63 so as to move the regulating plates 61 and 62 following the movement of the magnets 51 and 52. For example, the program is stored in a storage medium, such as a hard disk, a compact disc, a magnetic optical disk, or a memory card, and is installed in the computer.

Next, an operation of the sputtering apparatus 1 as described above will be described. First, the transfer port 17 of the processing chamber 11 is opened, and the wafer 10 is placed on the substrate support 2 by collaborative work of the external transport arm and the push-up pin (not illustrated). Next, the transfer port 17 is closed, and the substrate support 2 is moved to the first position at a height position at the time of the film formation. Further, Ar gas is introduced into the processing chamber 11 and the processing chamber is evacuated by the vacuum pump 15 to maintain the inside of thereof at a predetermined degree of vacuum.

Further, a DC voltage is applied from the power supply unit 34 to the target electrodes 3A and 3B to form plasma in the processing chamber 11. When a DC voltage is applied to the target electrodes 3A and 3B, an electric field is generated around the target electrodes 3A and 3B. When electrons accelerated by this electric field collide with the Ar gas, the Ar gas is ionized and new electrons are generated. Also, the magnets 51 and 52 generate a magnetic field along the surface of the target 31 where the magnets 51 and 52 are located, and an electric field near the target 31 and the magnetic field accelerate the electrons.

Due to this acceleration, electrons having sufficient energy further collide with Ar gas to cause ionization to form plasma, and Ar ions in the plasma sputter the target 31. Then, the target particles are radially (in a shape of hemisphere) emitted from the surface of the target 31 on which the magnets 51 and 52 are located toward the wafer 10 on the substrate support 2. The regulating plates 61 and 62 are present between the wafer 10 on the substrate support 2 and the target 31, and the regulating plates 61 and 62 guide the incidence of the target particles. Then, the target particles that have passed through the regulating plates 61 and 62 are incident on the wafer 10 through the slit 44 and adhere to the wafer 10.

Figure 4:
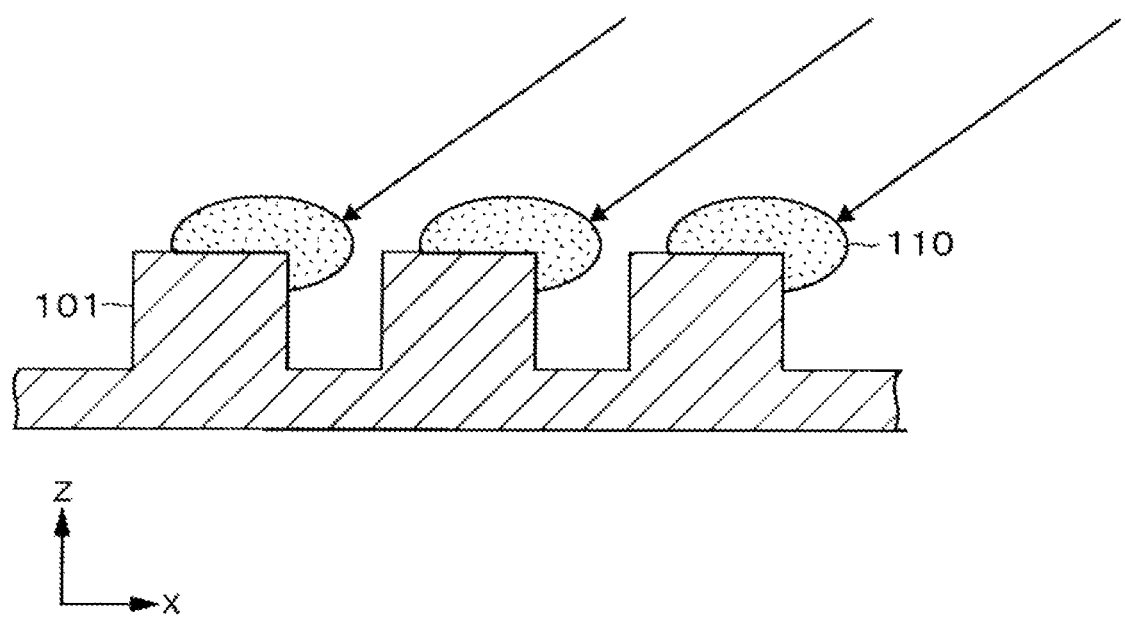
FIG. 4 is a vertical sectional side view for describing the operation of the sputtering apparatus.

As described above, the regulating plates 61 and 62 are provided in order to prevent the target particles radially emitted from the target 31 with an incident angle deviating from a preset angle range from being incident on the wafer 10. FIG. 4 schematically illustrates how the target particles emitted from the target 31 of the target electrode 3A are incident on a pattern 101 of a device formed on the wafer 10 and deposited on the pattern 101.

During this sputtering process, the magnets 51 and 52 of the magnet units 5A and 5B repeatedly move back and forth between, for example, one end and the other end of the target 31 in the Y direction at a rate of one round-trip every several seconds. As described above, plasma is generated on the surface of the target 31 at the positions where the magnets 51 and 52 are present. Therefore, a plasma generation location on the surface of the target 31 also moves by the movement of the magnets 51 and 52, and a plasma state is adjusted so that the target particles can be emitted from the entire surface of the target 31.

Then, following the movement of the magnets 51 and 52, the regulating plates 61 and 62 also repeatedly move back and forth in the Y direction so as to maintain the above-described positional relationship with the magnets 51 and 52. As a result, as will be described below, the regulating plates 61 and 62 limit the incident angle at which the target particles emitted from the target 31 are incident on the wafer 10 on the substrate support 2, and, thus, directivity of the target particles is controlled. Controlling the directivity of the target particles in this example means controlling the incident angle of the target particles with respect to the wafer 10 when viewed from above.

Meanwhile, the wafer 10 moves back and forth in the X direction between the first position and the second position by the substrate support moving mechanism 21 at a rate of one round-trip every several tens of seconds to several minutes, for example. By moving the wafer 10 between the first position and the second position, the entire surface of the wafer 10 passes below the slit 44 and, thus, the target particles having a limited incident angle are deposited on the entire surface of the wafer 10. In this way, the sputtering process for forming the metal film is performed on the entire surface of the wafer 10 while the directivity of the target particles is under control. By way of controlling the directivity of the target particles in this way, for example, the target particles are directed to the pattern 101 on the wafer 10 at an incident angle within a predetermined range, and a sputtering process for forming a film on a portion of the pattern 101 or the like can be performed.

Next, the operations of the regulating plates 61 and 62 will be described with reference to FIGS. 5 to 7. FIGS. 5 and 7 schematically illustrate a relationship between (i) the positional relationship between the magnets 51 and 52 and the regulating plates 61 and 62 when viewed from above and (ii) the incident angle of the target particles. In addition, a plan view schematically illustrating the state of deposition of the metal film on the wafer 10 is also illustrated. In the drawings, among the patterns 101 of the device formed on the wafer 10, the pattern 101 at the position corresponding to the center O3 of the slit 44 is illustrated. In this example, the pattern 101 has a rectangular tip portion when viewed from above. Although the target particles are actually emitted from the surface of the target 31 where the magnets 51 and 52 are located, the target 31 is not illustrated in FIGS. 5 and 7.

Figure 5A:
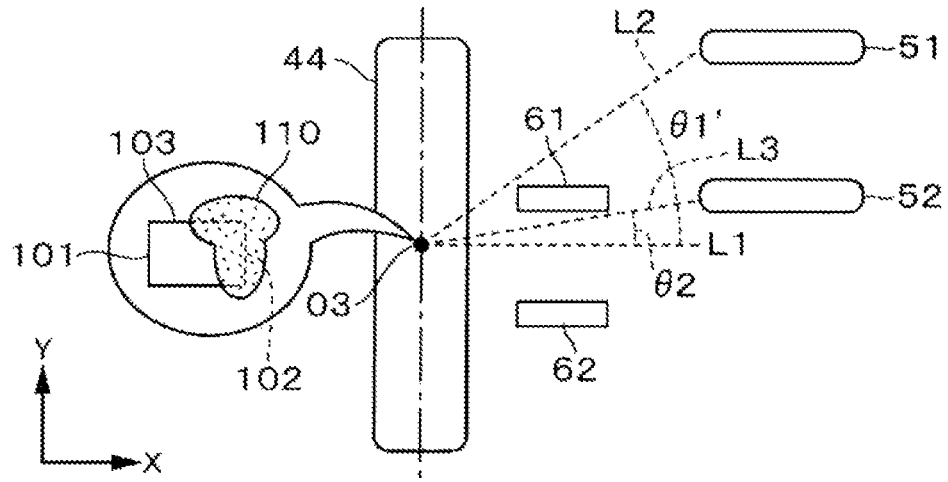
FIGS. 5A through 5C are plan views for describing the operation of a sputtering apparatus according to a comparative embodiment.
Figure 5B:
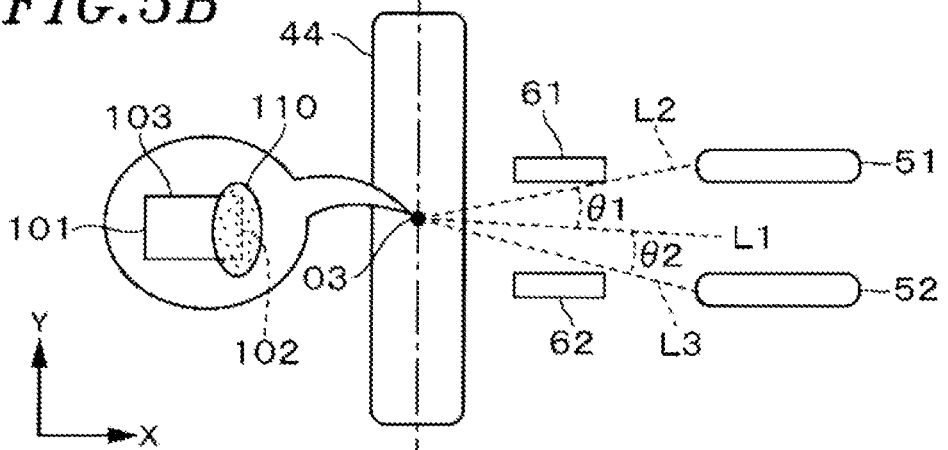
Figure 5C:
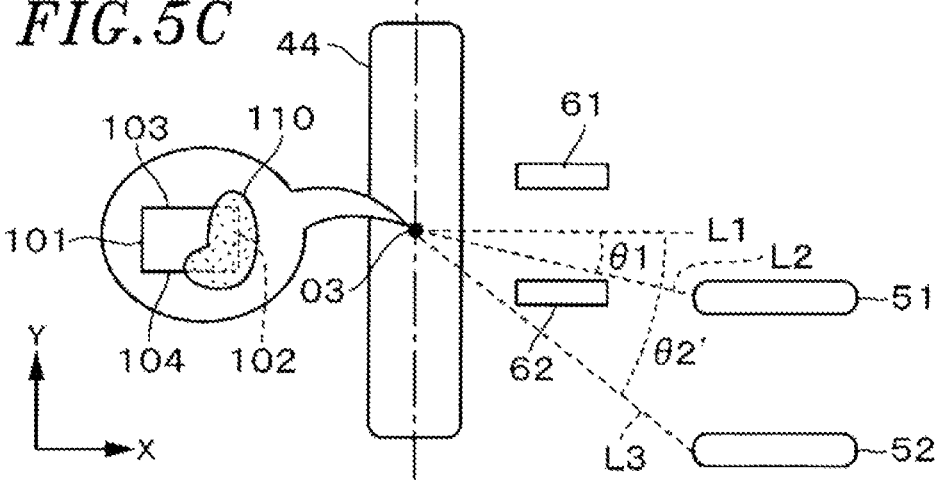

FIGS. 5A through 5C illustrate an example of a comparative embodiment in which, when the positions of the regulating plates 61 and 62 are fixed and the magnets 51 and 52 move in the Y direction, the positional relationship between the magnets 51 and 52 and the regulating plates 61 and 62 changes. In FIG. 5B, the magnets 51 and 52 and the regulating plates 61 and 62 have a positional relationship similar to that of the above-described embodiment, in which their central positions O4 and O5 are aligned in the Y direction. In this positional relationship, among the target particles radially emitted from the target 31 on which the magnets 51 and 52 are located, only target particles having a small incident angle pass between the regulating plates 61 and 62 and are incident on the wafer.

The incident angle in the example illustrated in the drawings, when viewed from above, refers to angles θ1 and θ2 formed between a straight line L1 extending in the X direction from the center O3 of the slit 44 and straight lines L2 and L3 connecting the center O3 to the magnets 51 and 52. In this case, since only the target particles having a narrow incident angle are incident on the wafer 10, with respect to the pattern 101 disposed at the position of the center O3, a metal film is attached to one end 102 of the rectangular tip portion extending in the Y direction while facing the target 31.

Here, when directivity control is performed using the collimator 6, the angles θ1 and θ2 illustrated in FIG. 5B are adjusted in a range of 20° to 25°.

FIG. 5A illustrates a case where the positions of the regulating plates 61 and 62 are fixed and the magnets 51 and 52 are positioned on only one side in the Y direction. Under this positional relationship, among the target particles emitted from the surface of the target 31 on which the magnet 52 is located, only the target particles with a low incident angle θ2 that have passed between the regulating plates 61 and 62 are incident on the wafer 10. Among the target particles emitted from the surface of the target 31 on which the magnet 51 is located, the target particles with a high incident angle θ1' that have passed outside the regulating plate 61 are incident on the wafer 10 in an oblique direction. In this case, the target particles having the low incident angle θ2 adhere to one end 102 of the tip portion of the pattern 101 described above. On the other hand, the target particles having the high incident angle θ1' adhere to the side 103 on one side of the tip portion of the pattern 101, and the metal film is inadvertently deposited in the shape 110 illustrated in FIG. 5A.

Further, FIG. 5C illustrates a case where the positions of the regulating plates 61 and 62 are fixed and the magnets 51 and 52 are positioned only on the other side in the Y direction. Under this positional relationship, among the target particles emitted from the magnet 51, only the target particles with a low incident angle θ1 that have passed between the regulating plates 61 and 62 are incident on the wafer 10. Among the target particles emitted from the magnet 52, the target particles with a high incident angle θ2' that have passed the outside the regulating plate 62 are incident on the wafer 10. Therefore, as illustrated in FIG. 5C, a metal film is formed on one end 102 of the pattern 101 and a side 104 on the other side of the pattern 101.

Although it depends on the size and shape of the pattern 101, when the angles θ1' and θ2' illustrated in FIGS. 5A and 5B are 40° or more, the metal film may be deposited at an unplanned position, and sufficient directivity control may not be achieved.

Figure 6:
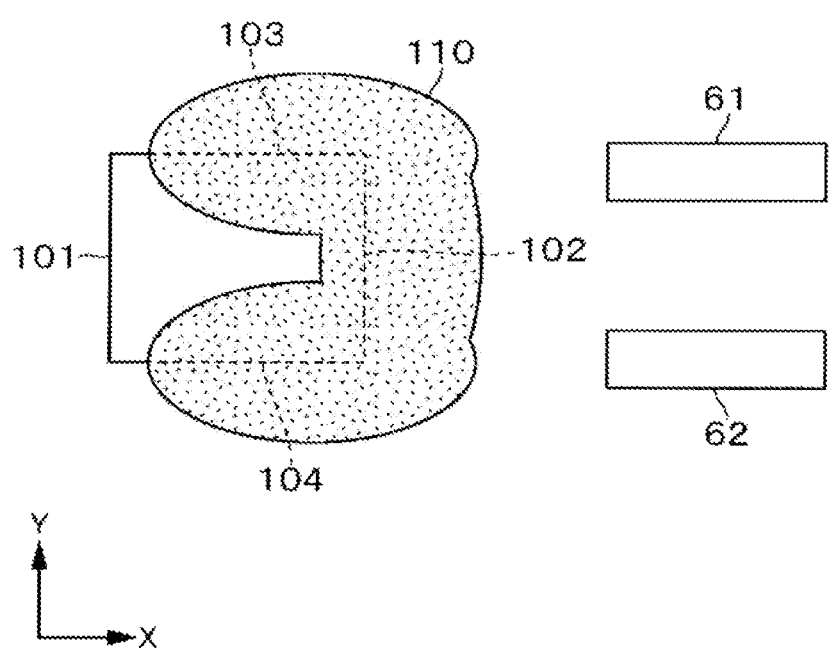
FIG. 6 is a plan view for describing the operation of the sputtering apparatus according to the comparative embodiment.

FIG. 6 is a plan view illustrating a metal film formed on the pattern 101 by performing a sputtering process under the positional relationship in which the positions of the regulating plates 61 and 62 are fixed while the magnets 51 and 52 are moved, as described with reference to FIGS. 5A to 5C. When the magnets 51 and 52 move back and forth in the Y direction to perform the sputtering process, the positional relationship between the magnets 51 and 52 and the regulating plates 61 and 62 repeatedly changes among states of FIG. 5A→FIG. 5B→FIG. 5C. Therefore, the incident angle of the target particles varies depending on the positions of the magnets 51 and 52, and it becomes difficult to control the directivity of the target particles. As a result, as illustrated in FIG. 6, the metal film is inadvertently formed in a shape in which the metal film is deposited on the one end 102 of the pattern 101 and both side surfaces 103 and 104.

Figure 7A:
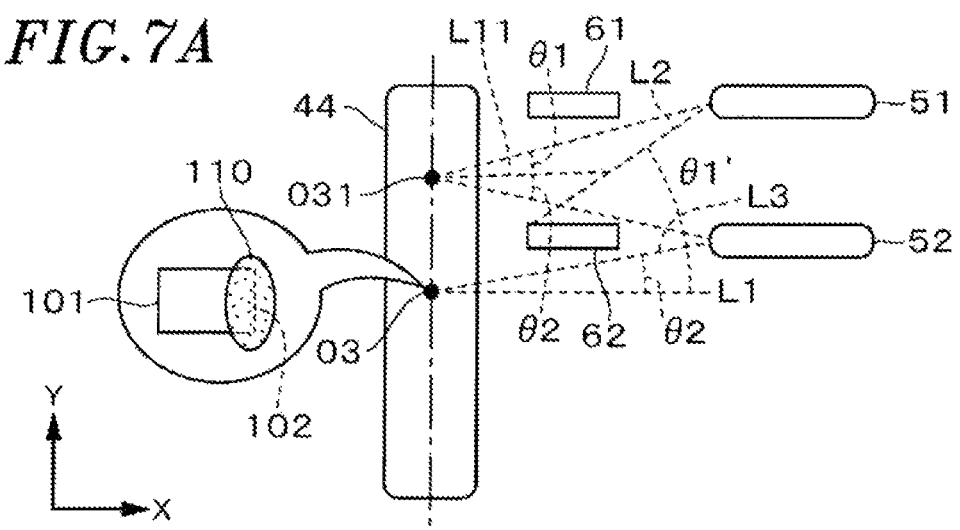
FIGS. 7A through 7C are plan views for describing the operation of the sputtering apparatus according to the first embodiment.
Figure 7B:
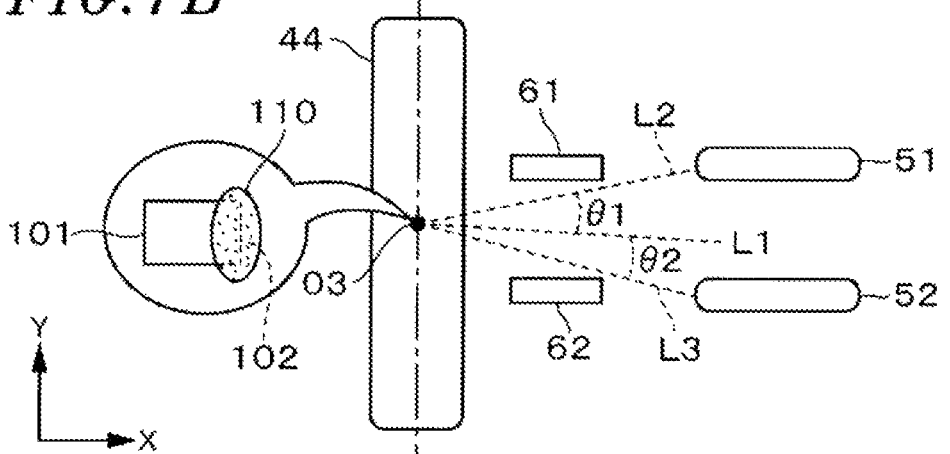
Figure 7C:
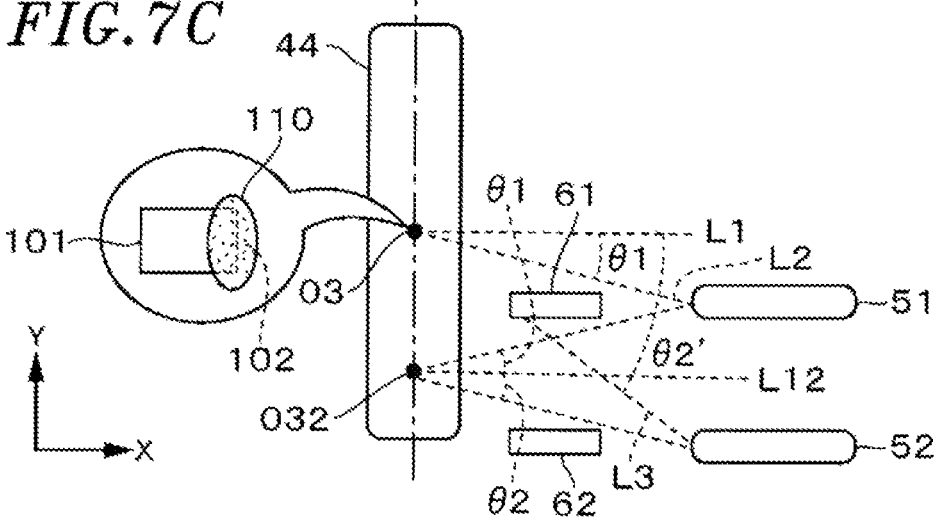

In contrast to the above-described comparative embodiment, FIGS. 7A through 7C illustrate an embodiment in which the regulating plates 61 and 62 are moved following the movement of the magnets 51 and 52, and the positional relationship in which their center positions O4 and O5 in the Y direction are aligned when viewed from above is maintained between the magnets 51 and 52 and the regulating plates 61 and 62. FIG. 7A illustrates a case where the magnets 51 and 52 and the regulating plates 61 and 62 are located on one side in the Y direction. Among the target particles derived from the magnet 52 and radially emitted from the surface of the target 31, only the target particles having a low incident angle θ2 are incident on the wafer 10 due to the presence of the regulating plate 62.

Meanwhile, the presence of the regulating plate 62 hinders the incidence of the target particles with a high incident angle θ1' among the target particles emitted from the magnet 51. As described above, since only the target particles having a low incident angle are incident on the wafer 10, in a case where one end 102 of the pattern 101 is present at the incident position, a metal film is formed only on that one end 102.

Target particles are incident with low incident angles θ1 and θ2 on the intersection O31 of (i) a slit center line (dash-single dotted line in FIGS. 7A to 7C) passing through the center O3 of the slit 44 and extending along a longitudinal direction of the slit 44 and (ii) a midline L11 between the regulating plates 61 and 62.

FIG. 7B illustrates a case where the magnets 51 and 52 and the regulating plates 61 and 62 are located at the center position in the Y direction in their movement range. In this case, as in FIG. 5B, due to the presence of the regulating plates 61 and 62, only the target particles having a low incident angles θ1 and θ2 are incident on the wafer 10 and, thus, a metal film is formed on only one end 102 of the pattern 101.

FIG. 7C illustrates a case where the magnets 51 and 52 and the regulating plates 61 and 62 are located on the other side in the Y direction. Among the target particles emitted from the magnet 51, only the target particles having a low incident angle θ1 are incident on the wafer 10 due to the presence of the regulating plate 61. Meanwhile, the presence of the regulating plate 61 hinders the incidence of the target particles having the high incident angle θ2' among the target particles emitted from the magnet 52. Since only the target particles having a low incident angle are incident on the wafer 10, the metal film is formed only on one end 102 of the pattern 101.

Further, the target particles are incident with the low incident angles θ1 and θ2 on the intersection O32 of the slit center line and a midline L12 between the regulating plates 61 and 62.

In this example, since the regulating plates 61 and 62 are moved following the movement of the magnets 51 and 52, the incidence of the target particles having a high incident angle on the wafer 10 is hindered. As a result, the directivity of the target particles incident on the wafer 10 passing outside the space between the two facing regulating plates 61 and 62 can also be controlled.

According to this embodiment, the incident angle of the target particles can be limited and the directivity of the target particles can be controlled by adjusting the positions where the regulating plates 61 and 62 are disposed according to the movement of the magnets 51 and 52. Further, the positions where the regulating plates 61 and 62 are disposed are adjusted by moving the two regulating plates 61 and 62 to follow the movement of the magnets 51 and 52 by means of the regulating plate movement mechanism 63. Therefore, it is possible to control the directivity of the target particles with a simple configuration without increasing the size and complexity of the apparatus.

In general, control of the directivity of the target particles in a magnetron sputtering device can be realized by using a regulating member with, for example, a honeycomb structure having an increased number of regulating plates, or by increasing the separation distance between the target and the wafer 10. However, these configurations have disadvantages because they would cause an increase in the complexity and the number of devices used. Therefore, as in the embodiment of the present disclosure, it is advantageous to control the directivity of target particles with a simple configuration while maintaining a footprint of the device.

Further, by moving the magnets 51 and 52, the discharge portion on the surface of the target 31 is moved according to the movement of the magnets 51 and 52 and, thus, the efficiency in utilizing the target 31 can be improved. In this example, by moving the magnets 51 and 52 having a smaller area than the target 31, discharge may occur on the entire surface of the target 31, which can effectively improve the utilization efficiency of the target 31 with an inexpensive configuration. Further, by moving the discharge portion of the target 31, the desired metal film can be uniformly formed on the entire surface of the wafer 10.

Second Embodiment

Figure 8:
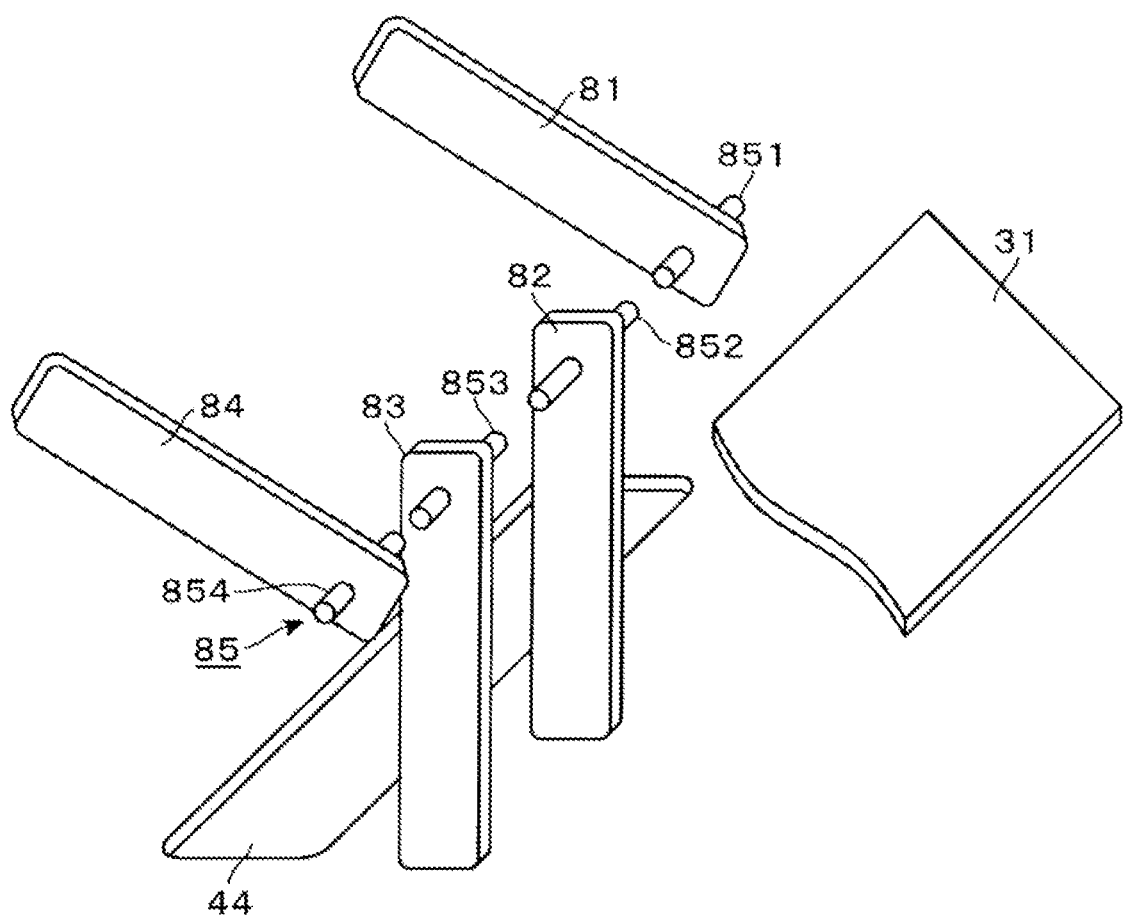
FIG. 8 is a schematic perspective view illustrating a portion of a sputtering apparatus according to a second embodiment.

Next, a second embodiment of the sputtering apparatus of the present disclosure will be described with reference to FIGS. 8 and 9. In this example, each of collimators 8A and 8B (8B is not illustrated) includes, for example, four regulating plates 81 to 84, and two of the four regulating plates move to regulation positions according to the movement of the magnets 51 and 52. Locations where the collimators 8A and 8B are disposed and components other than the collimators 8A and 8B are configured in the same manner as in the first embodiment described with reference to FIGS. 1 and 2. In FIGS. 8 and 9, components similar to those in the first embodiment are designated by the same reference numerals, and repeated descriptions thereof will be omitted.

Figure 9A:
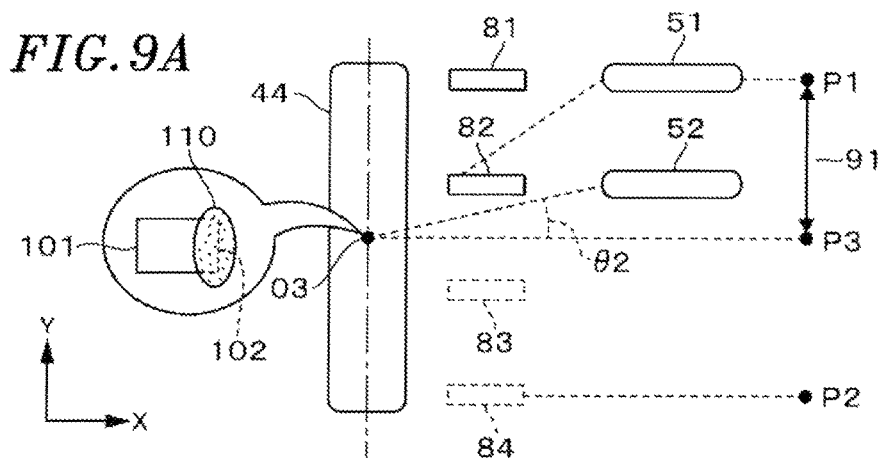
Figure 9B:
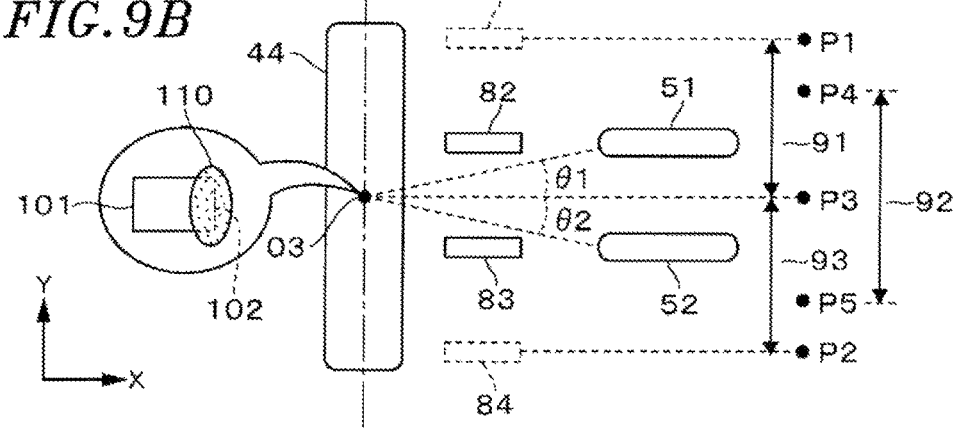
Figure 9C:
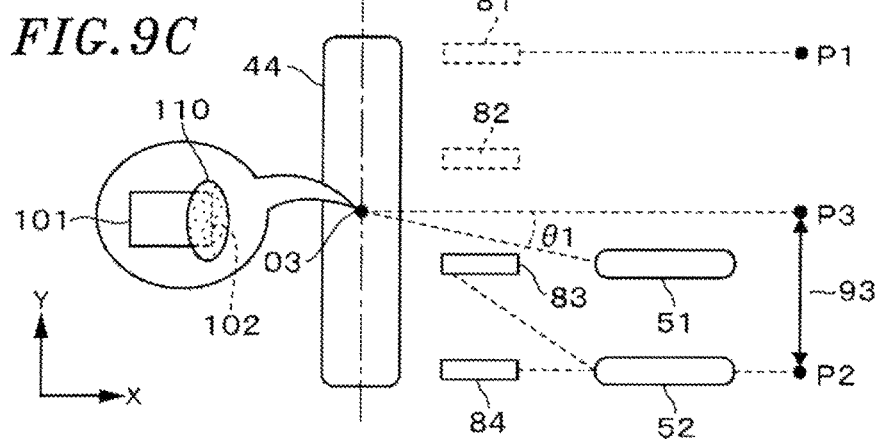

For example, the four regulating plates 81 to 84 are formed to have the same shape and size as those of the regulating plates 61 and 62 of the first embodiment. The regulating plates 81 to 84 are spaced apart from each other, and are movable by an arrangement position adjustment mechanism 85 between a regulation position between the substrate support 2 and the target 31 and a retraction position retracted from the regulation position. FIG. 8 illustrates a state where the regulating plates 82 and 83 are located at their regulation positions and the regulating plates 81 and 84 are located at their retraction positions. FIGS. 9A through 9C are plan views schematically illustrating the positional relationship between the magnets 51 and 52 and the regulating plates 81 to 84, the regulating plates located at the regulation positions are illustrated by solid lines, and the regulating plates located at the retraction positions are illustrated by broken lines.

The arrangement position adjustment mechanism 85 includes horizontal rotating shafts 851, 852, 853, and 854 fixed to the regulating plates 81, 82, 83, and 84, and drive motors (not illustrated) are provided in the rotating shafts 851, 852, 853, and 854. The arrangement position adjustment mechanism 85 rotates each drive motor according to the movement of the magnets 51 and 52 based on a command from the control unit 100. By this operation, two adjacent regulating plates of the four regulating plates 81 to 84 are moved to their regulation positions, and the remaining regulating plates are moved to their retraction positions. In this example, the regulation position is a position between the slit 44 and the target 31, for example, where long sides of the regulating plates 81 to 84 are substantially orthogonal to the wafer 10 on the substrate support 2. Moreover, the retraction position is a position where the regulating plates 81 to 84 rotate from the regulation position to the slit 44 which is the opposite direction with respect to the target 31 and fall out of the space between the substrate support 2 and the target 31.

Next, the movement range of the magnets 51 and 52 of the magnet units 5A and 5B and the placement of the regulating plates 81 to 84 located at their regulation positions will be described with reference to FIG. 9. The movement range in which the magnets 51 and 52 move is divided into, for example, three divided sections 91 to 93. As described above, the magnets 51 and 52 move back and forth between, for example, one end (position illustrated in FIG. 9A) and the other end (position illustrated in FIG. 9C) of the target 31. Further, when viewed from above, as illustrated in FIG. 9A, the regulating plates 81 and 82 at their regulation positions are disposed at positions corresponding to the magnets 51 and 52 on one end side. Further, when viewed from above, as illustrated in FIG. 9C, the regulating plates 83 and 84 at their regulation positions are disposed at positions corresponding to the magnets 51 and 52 on the other end side.

Continuing the description with reference to FIG. 9, in this example, the magnets 51 and 52 move between a position P1 on the one end side and a position P2 on the other end side in the Y direction when viewed from above, and, thus, a range between the position P1 and the position P2 correspond to the movement range of the magnets 51 and 52. Further, the center position of the movement range, i.e., the position in the Y direction corresponding to the center O3 of the slit 44 in this example, is set as a position P3. In this configuration, a first divided section 91 is set to a section from the position P1 to the position P3, and a third divided section 93 is set to a section from the position P2 to the position P3.

Further, for example, the center position between the regulating plate 81 and the regulating plate 82 at their regulation positions in the Y direction is defined as a position P4, and the center position between the regulating plate 83 and the regulating plate 84 at their regulation positions in the Y direction is defined as a position P5. A second divided section 92 is set to a section from the position P4 to the position P5. As described above, the first divided section 91 and the second divided section 92 overlap each other, and the second divided section 92 and the third divided section 93 overlap each other.

In this way, the regulating plates 81 to 84 are disposed in association with the divided sections 91 to 93. For example, the regulating plates 81 and 82 are disposed in association with the first divided section 91, the regulating plates 82 and 83 are disposed in association with the second divided section 92, and the regulating plates 83 and 84 are disposed in association with the third divided section 93. During a period while the magnets 51 and 52 are moving in one of the divided sections, the arrangement position adjustment mechanism 85 is configured to move the two regulating plates associated with that divided section to their regulation positions and the other regulating plates to their retraction positions.

Specifically, FIG. 9B illustrates an example in which the magnets 51 and 52 move in the second divided section 92, the regulating plates 82 and 83 are moved to their regulation positions accordingly, and the remaining plates 81 and 84 are moved to their retraction positions. When the magnets 51 and 52 are moved from the current positions to the first divided section 91, the regulating plate 81 is moved to the regulation position and the regulating plate 83 is moved to the retraction position, for example, at the moment when the magnet 51 leaves the second divided section 92. In this way, as illustrated in FIG. 9A, when the magnets 51 and 52 move in the first divided section 91, the regulating plates 81 and 82 move to their regulation positions and the regulating plates 83 and 84 move to their retraction positions.

Further, the magnets 51 and 52 are moved to the third divided section 93 from the position illustrated in FIG. 9B. In this case, the regulating plate 84 is moved to the regulation position and the regulating plate 82 is moved to the retraction position, for example, at the moment when the magnet 52 leaves the second divided section 92. In this way, when the magnets 51 and 52 move in the third divided section 93, the regulating plates 83 and 84 are moved to their regulation positions.

In this example, during a period while the magnets 51 and 52 are moving in the first divided section 91, the incident angle of the target particles is limited by the regulating plates 81 and 82, and as illustrated in FIG. 9A, the target particles having a low incident angle θ2 are incident on the wafer 10. Further, during a period while the magnets 51 and 52 are moving in the second divided section 92, the incident angle of the target particles is limited by the regulating plates 82 and 83, and as illustrated in FIG. 9B, the target particles having low incident angles θ1 and θ2 are incident on the wafer 10. Further, during a period while the magnets 51 and 52 are moving in the third divided section 93, the incident angle of the target particles are limited by the regulating plates 83 and 84, and as illustrated in FIG. 9C, the target particles having a low incident angle θ1 are incident on the wafer 10.

Therefore, also in this embodiment, as in the first embodiment, the regulating plates 61 and 62 are disposed according to the movement of the magnets 51 and 52. Therefore, it is possible to limit the incident angle of the target particles and control the directivity of the target particles with a simple configuration without increasing the complexity or the size of the footprint of the device. In addition, this embodiment also encompasses a case where a period for performing the sputtering process while all the regulating plates 81 to 84 are disposed at their retraction positions is provided in the course of performing the sputtering by using the desired film forming process.

In addition, a modification example (not illustrated) of the second embodiment will be described. In this example, two regulating plates are prepared for each of the first to third divided sections, and by the arrangement position adjustment mechanism, the two regulating plates are disposed at their regulation positions and the remaining regulating plates are disposed at their retraction positions in response to the movement of the magnets. For example, the arrangement position adjustment mechanism includes a rotating shaft common to the six regulating plates and a drive motor for rotating the rotating shaft. The six regulating plates are fixed at their corresponding positions on the rotating shaft in its length direction (Y direction) for each of the first to third divided sections, by changing positions of the rotating shaft in a circumferential direction. For example, positions of the rotating shaft in the circumferential direction are set to positions rotated by 120° in the circumferential direction.

During the period when the magnets move to the first divided section, two regulating plates corresponding to the first divided section are disposed at their regulation positions. As a result, the two regulating plates corresponding to the second divided section are retracted to their retraction positions pivoted away from the regulation positions by 240° clockwise, for example. Further, the two regulating plates corresponding to the third divided section are retracted to their retraction positions pivoted away from the regulation positions by 120° clockwise. The size and arrangement position of the regulating plates and the target are set so that the two regulating plates retracted to their retraction positions are located out of the space between the substrate support and the target.

Next, during the period when the magnets move from the first divided section to the second divided section, the rotating shaft is rotated by 120° clockwise, and two regulating plates corresponding to the second divided section are disposed at their regulation positions. Accordingly, the regulating plates corresponding to the third divided section are retracted to their retraction positions pivoted away from the regulation positions by 240° clockwise, and the regulating plates corresponding to the first divided section are retracted to their retraction positions pivoted away from the regulation positions by 120° clockwise.

Further, during the period when the magnets move from the second divided section to the third divided section, the rotating shaft is rotated by 120° clockwise, and two regulation plates corresponding to the third divided section are disposed at their regulation positions. Accordingly, the regulating plates corresponding to the first divided section are retracted to their retraction positions pivoted away from the regulation positions by 240° clockwise, and the regulating plates corresponding to the second divided section are retracted to their retraction positions pivoted away from the regulation positions by 120° clockwise. Even with such a configuration, the regulating plates are disposed according to the movement of the magnets, and, thus, it is possible to limit the incident angle of the target particles and control the directivity of the target particles.

In the above, the number of magnets provided in the magnet unit is not limited to two and may be one or three or more. Further, the number of regulating plates is not limited to two and may be three or more. For example, when three magnets are provided, three regulating plates may be disposed according to the movement of the magnets.

Further, although, in the above-described embodiments, the magnets are moved between a position on one side and a position on the other side in the front-rear direction (Y direction in FIG. 2) on the rear surface of the target, the moving direction of the magnet is not limited to this direction. The magnets may be moved between a position on one side and a position on the other side in the lateral direction (X direction in FIG. 2) in a plan view along the target provided obliquely with respect to the substrate support.

Also in this case, for example, the slit, which is an opening portion, extends in the X direction along the moving direction of the magnets, and the wafer W is moved in the Y direction. Further, the regulating plates are disposed between the magnets and the slits according to the movement of the magnets. Therefore, in the configuration of the first embodiment, the regulating plates are configured to move in the moving direction of the magnets. Further, in the second embodiment, the regulating plates are arranged in the moving direction of the magnets, and the two regulating plates are configured to move to their regulation positions according to the movement of the magnets. Further, the magnets may be moved between the position on one side and the position on the other side set across the center portion on the rear surface of the target. For example, the positions may be closer to the center than to one end and the other end of the rear surface of the target in the moving direction.

While various embodiments have been described above, the presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof

What is claimed is:

1. An apparatus for performing a sputtering process on a substrate, the apparatus comprising:
    a processing chamber configured to accommodate a substrate and having a substrate support on which the substrate is placed;
    a target, having a surface facing the substrate placed on the substrate support, for emitting target particles to be adhered to the substrate by plasma formed in the processing chamber;
    a magnet, provided on a rear surface of the target when viewed from the substrate support side, for adjusting a state of the plasma on the surface of the target;
    a magnet moving mechanism for repeatedly moving the magnet between a position on one side and a position on the other side set across a center portion on the rear surface of the target; and
    a collimator provided between the substrate support and the target, the collimator including two regulating plates, disposed apart from each other and facing each other, for limiting an incident angle at which the target particles emitted from the target are incident on the substrate placed on the substrate support, and an arrangement position adjustment mechanism for adjusting positions at which the two regulating plates are disposed according to the movement of the magnet,
    wherein positions of the regulating plates with respect to the magnet are maintained when the magnet moves between the position on one side and the position on the other side,
    wherein the arrangement position adjustment mechanism is configured as a regulating plate movement mechanism for moving the two regulating plates following the movement of the magnet, and
    wherein the regulating plate movement mechanism is configured to move the two regulating plates in the moving direction of the magnet.

2. An apparatus for performing a sputtering process on a substrate, the apparatus comprising:
    a processing chamber configured to accommodate a substrate and having a substrate support on which the substrate is placed;
    a target, having a surface facing the substrate placed on the substrate support, for emitting target particles to be adhered to the substrate by plasma formed in the processing chamber;
    a magnet, provided on a rear surface of the target when viewed from the substrate support side, for adjusting a state of the plasma on the surface of the target;
    a magnet moving mechanism for repeatedly moving the magnet between a position on one side and a position on the other side set across a center portion on the rear surface of the target; and
    a collimator provided between the substrate support and the target, the collimator including two regulating plates, disposed apart from each other and facing each other, for limiting an incident angle at which the target particles emitted from the target are incident on the substrate placed on the substrate support, and an arrangement position adjustment mechanism for adjusting positions at which the two regulating plates are disposed according to the movement of the magnet,
    wherein positions of the regulating plates with respect to the magnet are maintained when the magnet moves between the position on one side and the position on the other side,
    wherein, when a movement range in which the magnet moves is divided into three or more divided sections, the number of regulating plates included in the collimator is more than or equal to three, and each of the regulating plates is disposed in association with each of the divided sections and configured to be movable between its regulation position between the substrate support and the target and its retraction position retracted from the regulation position, and
    during a period when the magnet moves in one of the divided sections, the arrangement position adjustment mechanism moves two of the regulation plates associated with said divided section to their regulation positions and moves remaining regulating plates to their retraction positions.

3. The apparatus of claim 1, further comprising:
    a shielding plate provided between the substrate support and the regulating plate and having an opening portion configured to expose a portion of the substrate placed on the substrate support; and
    a substrate support moving mechanism configured to laterally move the substrate support below the shielding plate so that an entire surface of the substrate placed on the substrate support passes below the opening portion when viewed from the target side.

4. The apparatus of claim 2, further comprising:
a shielding plate provided between the substrate support and the regulating plate and having an opening portion configured to expose a portion of the substrate placed on the substrate support; and
a substrate support moving mechanism configured to laterally move the substrate support below the shielding plate so that an entire surface of the substrate placed on the substrate support passes below the opening portion when viewed from the target side.

5. The apparatus of claim 1, wherein the number of magnets provided on the rear surface of the target is two, and the two regulating plates provided in the collimator use the two magnets in parallel to limit the incident angle of the target particles emitted from the target.

6. The apparatus of claim 2, wherein the number of magnets provided on the rear surface of the target is two, and the two regulating plates provided in the collimator use the two magnets in parallel to limit the incident angle of the target particles emitted from the target.

7. A method for performing a sputtering process on a substrate, the method comprising:
placing a substrate on a substrate support provided in a processing chamber;
forming plasma in the processing chamber, and emitting target particles from a surface of a target toward the substrate placed on the substrate support so as to be adhered to the substrate;
repeatedly moving a magnet provided on a rear surface of the target when viewed from the substrate support side between a position on one side and a position on the other side set across a center portion on the rear surface of the target to adjust a state of the plasma of the surface of the target; and
limiting, by a collimator provided between the substrate support and the target and including two regulating plates, disposed apart from each other and facing each other, an incident angle at which the target particles emitted from the target are incident on the substrate placed on the substrate support, by adjusting positions at which the two regulating plates are disposed according to the movement of the magnet.

8. The method of claim 7, wherein the adjusting of the positions at which the two regulating plates are disposed is carried out by moving the two regulating plates following the movement of the magnet.

9. The method of claim 7, wherein, when a movement range in which the magnet moves is divided into three or more divided sections, the number of regulating plates included in the collimator is more than or equal to three, and each of the regulating plates is disposed in association with each of the divided sections and configured to be movable between its regulation position between the substrate support and the target and its retraction position retracted from the regulation position, and
the adjusting positions at which the two regulating plates are disposed is performed, during a period when the magnet moves in one of the divided sections, by moving two of the regulation plates associated with said divided section to their regulation positions and moving remaining regulating plates to their retraction positions.

10. The method according to claim 7, wherein a shielding plate having an opening portion configured to expose a portion of the substrate placed on the substrate support is provided between the substrate support and the regulating plate, and
the method further comprising laterally moving the substrate support below the shielding plate so that the entire surface of the substrate placed on the substrate support passes below the opening portion when viewed from the target side.

11. The method according to claim 8, wherein a shielding plate having an opening portion configured to expose a portion of the substrate placed on the substrate support is provided between the substrate support and the regulating plate, and
the method further comprising laterally moving the substrate support below the shielding plate so that the entire surface of the substrate placed on the substrate support passes below the opening portion when viewed from the target side.

12. The method according to claim 9, wherein a shielding plate having an opening portion configured to expose a portion of the substrate placed on the substrate support is provided between the substrate support and the regulating plate, and
the method further comprising laterally moving the substrate support below the shielding plate so that the entire surface of the substrate placed on the substrate support passes below the opening portion when viewed from the target side.

13. The method according to claim 7, wherein the number of magnets provided on the rear surface of the target is two, and
the two regulating plates provided in the collimator use the two magnets in parallel to limit the incident angles of the target particles emitted from the target.

14. The method according to claim 8, wherein the number of magnets provided on the rear surface of the target is two, and
the two regulating plates provided in the collimator use the two magnets in parallel to limit the incident angles of the target particles emitted from the target.

15. The method according to claim 9, wherein the number of magnets provided on the rear surface of the target is two, and
the two regulating plates provided in the collimator use the two magnets in parallel to limit the incident angles of the target particles emitted from the target.

* * * * *